(12) United States Patent
Kim et al.

(10) Patent No.: US 9,240,571 B2
(45) Date of Patent: Jan. 19, 2016

(54) ORGANIC LIGHT EMITTING DIODE DISPLAY DEVICE AND METHOD OF MANUFACTURING THE SAME

(71) Applicant: LG DISPLAY CO., LTD., Seoul (KR)

(72) Inventors: YongChul Kim, Paju-si (KR); Sungbin Shim, Yangsan-si (KR)

(73) Assignee: LG Display Co., Ltd., Seoul (KR)

( * ) Notice: Subject to any disclaimer, the term of this patent is extended or adjusted under 35 U.S.C. 154(b) by 96 days.

(21) Appl. No.: 13/921,991

(22) Filed: Jun. 19, 2013

(65) Prior Publication Data

US 2014/0183460 A1  Jul. 3, 2014

(30) Foreign Application Priority Data

Dec. 31, 2012  (KR) .......... 10-2012-0158688

(51) Int. Cl.
| | |
|---|---|
| *H01L 29/08* | (2006.01) |
| *H01L 51/56* | (2006.01) |
| *H01L 51/52* | (2006.01) |
| *H01L 27/32* | (2006.01) |

(52) U.S. Cl.
CPC ............ *H01L 51/56* (2013.01); *H01L 27/3258* (2013.01); *H01L 51/5206* (2013.01); *H01L 51/5218* (2013.01); *H01L 51/5265* (2013.01); *H01L 27/3246* (2013.01); *H01L 2251/5315* (2013.01)

(58) Field of Classification Search
CPC . H01L 51/56; H01L 51/5206; H01L 51/5218; H01L 51/5265
USPC .......................................................... 257/40
See application file for complete search history.

(56) References Cited

U.S. PATENT DOCUMENTS

2009/0322657 A1* 12/2009  Na et al. .......................... 345/76

* cited by examiner

*Primary Examiner* — Douglas Menz
(74) *Attorney, Agent, or Firm* — Brinks Gilson & Lione

(57) ABSTRACT

Disclosed is an OLED display device. The OLED display device includes a substrate in which a plurality of pixels are defined, a thin film transistor formed in each of the pixels defined in the substrate, a passivation layer formed on the thin film transistor, a planarizing layer formed on the passivation layer and including a groove formed in an upper end portion of each pixel, a reflective electrode formed in the groove of the planarizing layer, an anode electrode formed on the reflective electrode, an organic emitting layer formed on the anode electrode, and a cathode electrode formed on the organic emitting layer.

23 Claims, 3 Drawing Sheets

ORGANIC LIGHT EMITTING DIODE DISPLAY DEVICE AND METHOD OF MANUFACTURING THE SAME

CROSS-REFERENCE TO RELATED APPLICATIONS

This application claims priority to Korean Patent Application No. 10-2012-0158688, filed on Dec. 31, 2012, the entirety of which is hereby incorporated by reference herein.

BACKGROUND

1. Field of the Invention

The present invention relates to an organic light emitting diode (OLED) display device and a method of manufacturing the same, and more particularly, to an active OLED display device and a method of manufacturing the same.

2. Discussion of the Related Art

With the advance of information communication technology, the demand for information display devices is rapidly increasing, and thus, the research and development of information display devices are being actively done. As the research and development of information display devices accelerate, display devices tend to realize a large screen, high resolution, a thin thickness, high definition, and a light weight.

Today is the mobile age, and, as a representative type of information display device which has noticeable advantages in thinning and lightening, flat panel display devices include liquid crystal display (LCD) devices, OLED display devices, etc.

Among such flat panel display devices, the OLED display devices have low power consumption, a good contrast ratio, a wide viewing angle, and a fast response time, and thus are attracting much attention as next generation flat panel display devices, following LCD devices. Also, recently, as research on enlargement is intensively done, technology for enhancing luminance uniformity and luminance is advancing.

In the technology for enhancing luminance, there is a micro-cavity. The micro-cavity denotes a state or structure in which light is repeatedly reflected in a certain section, and amplified by constructive interference. To apply the micro-cavity structure, a plurality of reflective electrodes which have different step heights for each pixel may be respectively formed in a plurality of anode electrodes.

FIG. 1 is a sectional view illustrating a portion of a related art OLED display device.

As illustrated in FIG. 1, the related art OLED display device includes a substrate 101, a thin film transistor TR, a passivation layer 110, a planarizing layer 120, a reflective electrode 130, and an anode electrode 140.

The thin film transistor TR is formed in each of a plurality of pixels P that are defined in the substrate 101, and the passivation layer 110 and the planarizing layer 120 are formed on the thin film transistor TR. The anode electrode 140 is formed on the planarizing layer 120, and the reflective electrode 130 is formed under the anode electrode 140. Although not shown, the reflective electrode 130 may be formed under the anode electrode 140, and the anode electrode 140 may include the reflective electrode 130.

The reflective electrode 130 includes a reflective layer 131. Between the reflective layer 131 and cathode electrodes (not shown), light emitted from an organic emitting layer (not shown) is repeatedly reflected, amplified by constructive inference, and emitted to the outside. In this case, the pixels P emit light of different wavelengths, and thus, a distance corresponding to an integer multiple of a half wavelength of the light emitted from each pixel P should be set as a distance over which the light is repeatedly reflected, for causing constructive interference. That is, a distance between the reflective layer 131 and the cathode electrode should match the distance corresponding to the integer multiple of the half wavelength of the light emitted from each pixel P. The distance between the reflective layer 131 and the cathode electrode is called an optical distance of the micro-cavity.

In order to set a plurality of the optical distances for each pixel P differently, the reflective electrode 130 may include a transparent layer 132. FIG. 1 illustrates an example in which the transparent layer 132 is formed in only the rightmost pixel P. However, the transparent layer 312 may be formed on any one or more of the plurality of pixels P depending on light emitted from each pixel P. Also, in order to set the optical distance suitable for each pixel P, the transparent layer 132 may be formed on one or more of the pixels P illustrated in FIG. 1.

In this way, when the transparent layers 132 are uniquely formed for each respective pixel P, the number of mask processes increases, which further causes a reduction in process efficiency.

SUMMARY

Accordingly, the present invention is directed to provide an OLED display device and a method of manufacturing the same that substantially obviate one or more problems due to limitations and disadvantages of the related art.

An aspect of the present invention relates to an OLED display device for enhancing efficiency of a process that forms a micro-cavity structure.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an OLED display device including: a substrate in which a plurality of pixels are defined; a thin film transistor formed in each of the pixels defined in the substrate; a passivation layer formed on the thin film transistor, and insulating the thin film transistor; a planarizing layer formed on the passivation layer to planarize unevenness of the thin film transistor, and including a groove formed in an upper end portion of each pixel; a reflective electrode formed in the groove of the planarizing layer; an anode electrode formed on the reflective electrode, and connected to the thin film transistor; an organic emitting layer formed on the anode electrode; and a cathode electrode formed on the organic emitting layer, wherein a plurality of the grooves have different depths according to a wavelength of light emitted from each of the pixels.

In another aspect of the present invention, there is provided a method of manufacturing an OLED display device, including: forming a thin film transistor in each of a plurality of pixels defined in a substrate; forming a passivation layer, which insulates the thin film transistor, on the thin film transistor; forming a planarizing layer, which planarizes unevenness of the thin film transistor, on the passivation layer; forming a plurality of grooves for each pixel, in an upper end portion of the planarizing layer; forming a reflective electrode in each of the grooves of the planarizing layer; forming an anode electrode, connected to the thin film transistor, on the reflective electrode; forming an organic emitting layer on the anode electrode; and forming a cathode electrode on the organic emitting layer, wherein the depths of the grooves differ according to a wavelength of light emitted from the respective pixels.

In another aspect of the present invention, there is provided An organic light emitting diode (OLED) display device, comprising: a substrate configured to include a group of pixels, wherein each pixel corresponds to a different color a thin film transistor disposed in each of the pixels defined in the substrate; a passivation layer disposed on the thin film transistor, and insulating the thin film transistor; and a planarizing layer disposed on the passivation layer and configured into a plurality of planarizing layer portions such that each planarizing layer portion corresponds to a different colored pixel, wherein each pixel corresponds to a planarizing layer portion, and each planarizing layer portion includes a groove portion having different groove depths that correspond to the different pixel colors.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the exemplary embodiments of the present invention, examples of which are illustrated in the accompanying drawings. Wherever possible, the same reference numbers will be used throughout the drawings to refer to the same or like parts.

Hereinafter, embodiments of the present invention will be described in detail with reference to the accompanying drawings.

Figure 1:
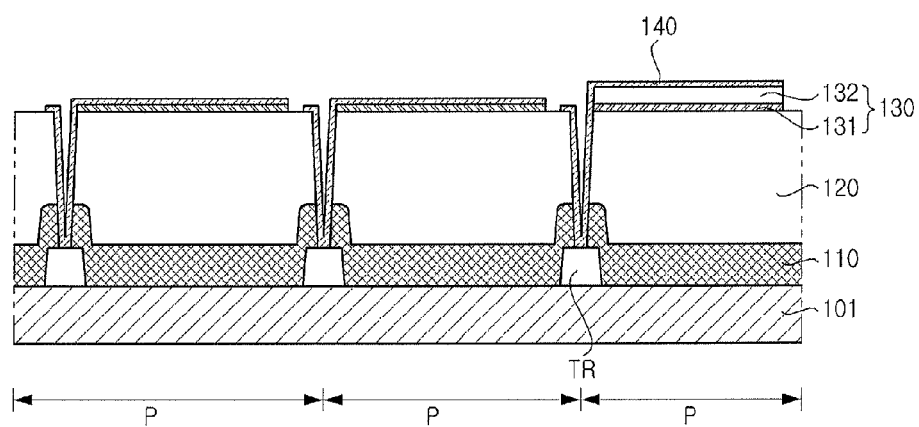
FIG. 1 is a sectional view illustrating a general OLED display device.
Figure 2:
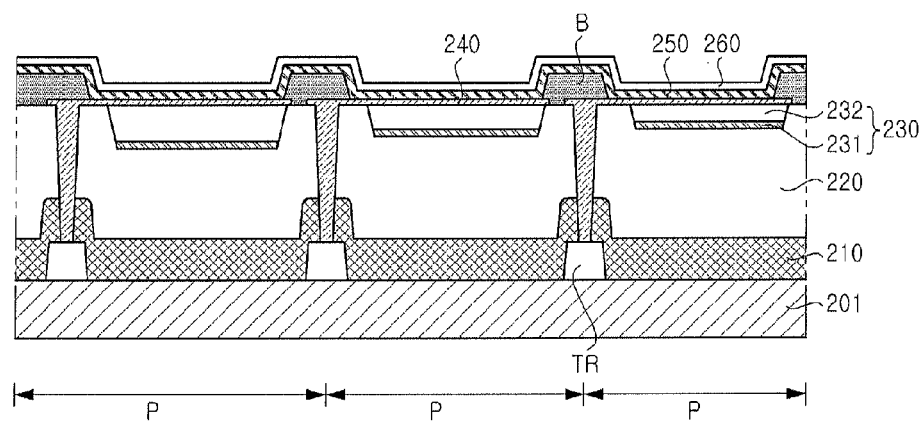
FIG. 2 is a sectional view illustrating an OLED display device according to an embodiment of the present invention.

FIG. 2 is a sectional view illustrating an OLED display device according to an embodiment of the present invention.

As illustrated in FIG. 2, the OLED display device according to an embodiment of the present invention includes a substrate 201, a thin film transistor TR, a passivation layer 210, a planarizing layer 220, a reflective electrode 230, an anode electrode 240, a bank layer B, an organic emitting layer 250, and a cathode electrode 260.

First, the substrate 210 may be formed of glass or flexible plastic. The flexible plastic may be formed of a material which is good in heat resistance and durability, in terms of a requirement characteristic of the substrate 201. For example, the substrate 201 may be formed of plastic such as polyethersulphone (PES), polyacrylate (PAR), polyehterimide (PEI), polyethylenenapthalate (PET), polyehtyleneterepthalate (PET), or the like.

Subsequently, the thin film transistor TR is formed on the substrate 201. The thin film transistor TR may include a switching thin film transistor and a driving thin film transistor. The switching thin film transistor may transfer a data signal to the driving thin film transistor according to a scan signal transferred from a gate line (not shown). The driving thin film transistor may transfer a source voltage to the anode electrode 220 by the transferred data signal, thereby driving the organic emitting layer 250.

Subsequently, the passivation layer 210 is formed on the thin film transistor TR. The passivation layer 210 may contain one of silicon oxide (SiOx) and silicon nitride (SiNx). The passivation layer 210 may be formed on the thin film transistor TR to insulate the thin film transistor TR from an upper structure, and can protect the thin film transistor TR in a later-performed process.

Subsequently, the planarizing layer 220 is formed on the passivation layer 210. The planarizing layer 220 may planarize the unevenness of the thin film transistor TR formed thereunder, and enable the anode electrode 240, organic emitting layer 250, and cathode electrode 260, which are formed on the planarizing layer 220, to be planarly formed stably. The planarizing layer 220 may be formed of photoacryl (PAC), or formed of an organic material having a planarization characteristic. For example, the planarizing layer 220 may be formed of an organic material such as acrylate, an epoxy-based polymer, or the like.

A plurality of grooves having different depths for each pixel P may be formed in an upper portion of the planarizing layer 220. Each of the grooves may be formed in an area corresponding to the anode electrode 240. The depths of the grooves may differ according to an integer multiple of a half wavelength of light emitted from the respective pixels P.

Subsequently, the reflective electrode 230 is formed in a corresponding groove of the planarizing layer 220. The reflective electrode 230 may repeatedly reflect light, emitted from the organic emitting layer 250, to the cathode electrode 260. Like this, light which is repeatedly reflected and amplified may be emitted through the anode electrode 240 or the cathode electrode 260. A top emission type is a type in which the light emitted from the organic emitting layer 250 is emitted in a direction of the cathode electrode 260, and a bottom emission type is a type in which the light emitted from the organic emitting layer 250 is emitted in a direction of the anode electrode 240.

The reflective electrode 230 may include a reflective layer 231 and a transparent layer 232. The reflective layer 231 may be formed of metal having a high reflectivity. For example, the reflective layer 231 may contain one of a metal group (having a high reflectivity) consisting of Al, Ag, Cu, Ni, Ti, and Ta. The reflective layer 231 may be formed in a bottom of the groove formed in the planarizing layer 220, and an optical distance may be formed between the reflective layer 231 and the cathode electrode 260.

The transparent layer 232 may be formed on the reflective layer 231. The transparent layer 232 may be formed to fill the groove formed in the upper end portion of the planarizing layer 220. That is, the sum of thicknesses of the transparent layer 232 and reflective layer 231 may be the same value as a depth of the groove formed in an upper end portion of the planarizing layer 220.

Since the transparent layer 232 is disposed in a middle position of a path through which light emitted from each pixel P is reflected, the transparent layer 232 may be formed of a transparent material having a high transmittance and a low reflectivity. Preferably, the transparent layer 232 may be formed of the same material as the anode electrode 240, and formed simultaneously with the anode electrode 240. For example, the transparent layer 232 may be formed of transparent conductive oxide, and preferably, may be formed of indium tin oxide (ITO), indium zinc oxide (IZO), or indium tin zinc oxide (ITZO).

Subsequently, the anode electrode 240 is formed on the reflective electrode 230. The anode electrode 240 supplies a positive hole to the organic emitting layer 250 with a source voltage transferred from the thin film transistor TR. Thus, the anode electrode 240 is connected to the thin film transistor TR. The anode electrode 240 may be formed of a material having a great work function so as to enable the supply of a positive hole to the organic emitting layer 250. Preferably, the anode electrode 240 may be formed of ITO, IZO, or ITZO.

The anode electrode 240 may be formed of the same material as the transparent layer 232. When the anode electrode 240 and the transparent layer 232 are formed of different materials, especially, respective materials having a great refractive index difference therebetween, the loss of light can be caused by total reflection in an interface between the anode electrode 240 and the transparent layer 232. Therefore, when the anode electrode 240 and the transparent layer 232 are formed of the same material, the loss of light can be prevented, and light efficiency can be enhanced.

Subsequently, the bank layer B is formed to partially overlap an edge of the anode electrode 240. The bank layer B may be formed at a boundary between adjacent pixels P to define a corresponding pixel P. Also, an emitting area of each pixel P may be defined by defining an area in which the anode electrode 240 and the organic emitting layer 250 contact each other. The bank layer B defines the emitting area of each pixel P, and prevents electrical charges from concentrating on a corner portion of the anode electrode 240, thus preventing deterioration of the anode electrode 240 and enhancing emission uniformity of each pixel P.

Subsequently, the organic emitting layer 250 is formed on the anode electrode 240 and the bank layer B. In the organic emitting layer 250, a positive hole supplied from the anode electrode 240 and an electrode supplied from the cathode electrode 260 are combined to generate an exiton, and then, the exiton is shifted to a ground state to emit light, thereby realizing a desired gray scale in each pixel P.

The organic emitting layer 250 of FIG. 2 is a WRGB type of organic emitting layer 250 emitting white light, and a color converting member (which is formed on the cathode electrode 260 or under the anode electrode 240), such as a color filter, converts light into desired color light, thereby emitting the desired color light to the outside.

Moreover, the organic emitting layer 250 may be formed separately in each pixel P, and may have an RGB type that directly emits color light emitted from each pixel P. The RGB type does not need the color converting member such as the color filter.

Subsequently, the cathode electrode 260 is formed on the organic emitting layer 250. The cathode electrode 260 may be formed of a material having a low work function, for supplying an electron to the organic emitting layer 250.

In the top emission type, the cathode electrode 260 may be formed of semitransparent metal able to transmit light. Therefore, the cathode electrode 260 may contain one of Ag, Mg, Ca, and Li, and may be formed as a thin film able to transmit light, for forming the cathode electrode 260 with transparent metal. In the bottom emission type, the cathode electrode 260 may be formed opaquely.

The cathode electrode 260 and the reflective layer 231 of the reflective electrode 230 may form the optical distance of the micro-cavity. Since the reflective layer 231 is formed in the bottom of the groove formed in the upper end portion of the planarizing layer 220, the optical distance may vary according to the depth of the groove, and an optical distance corresponding to an integer multiple of a half wavelength of light emitted from each pixel P may be by adjusting the depth of the groove.

Hereinafter, an optical distance of each pixel P based on the micro-cavity structure will be described in more detail.

The OLED display device includes the plurality of pixels P emitting light of different colors, and each pixel P emits light of three colors of red, green, and blue. In addition, the OLED display device may further include a plurality of pixels P emitting white, cyan, magenta, light blue, dark blue, orange, and yellow light.

In the pixel P emitting red light, a wavelength range of red visible light is about 610 to 700 nm, and thus, when a peak wavelength of the red visible light is about 655 nm that is an intermediate value, constructive interference due to the micro-cavity structure can occur in a case where a distance from the reflective layer 231 to the cathode electrode 260 is an integer multiple of about 327.5 nm that is half of 655 nm.

In the pixel P emitting green light, a wavelength range of green visible light is about 500 to 570 nm, and thus, when a peak wavelength of the green visible light is about 535 nm that is an intermediate value, constructive interference due to the micro-cavity structure can occur in a case where the distance from the reflective layer 231 to the cathode electrode 260 is an integer multiple of about 267.5 nm that is half of 535 nm.

In the pixel P emitting blue light, a wavelength range of blue visible light is about 450 to 500 nm, and thus, when a peak wavelength of the blue visible light is about 475 nm that is an intermediate value, constructive interference due to the micro-cavity structure can occur in a case where the distance from the reflective layer 231 to the cathode electrode 260 is an integer multiple of about 237.5 nm that is half of 475 nm.

Figure 3A:
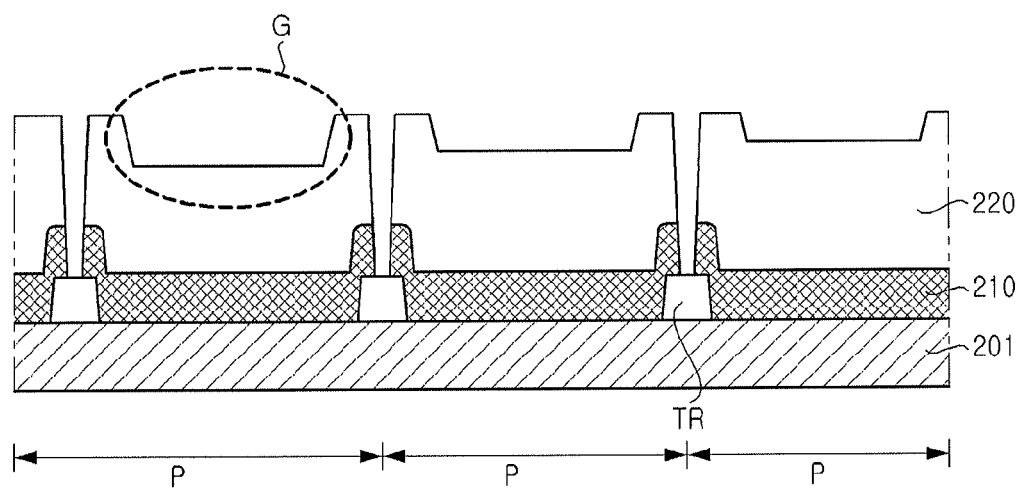
FIGS. 3A to 3C are sectional views illustrating a method of manufacturing the OLED display device according to an embodiment of the present invention.
Figure 3B:
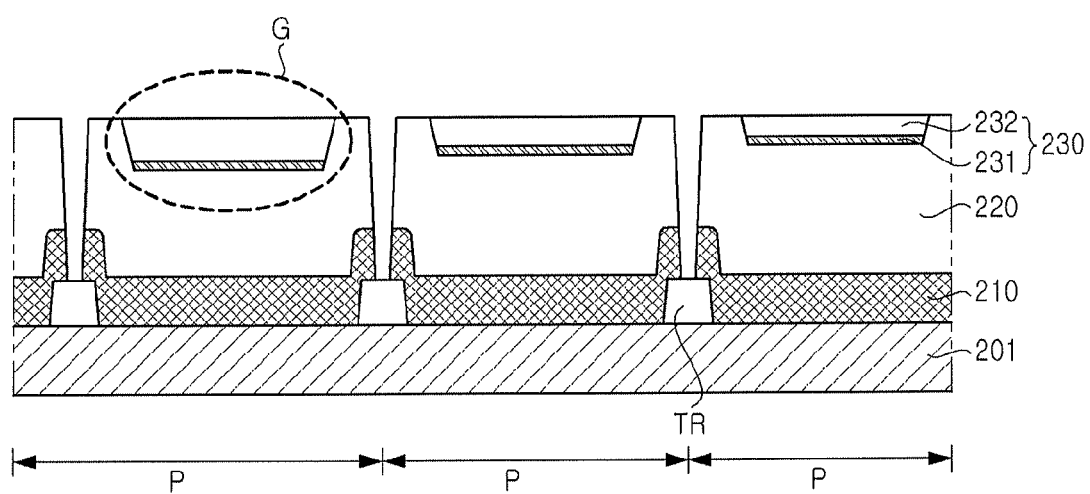
Figure 3C:
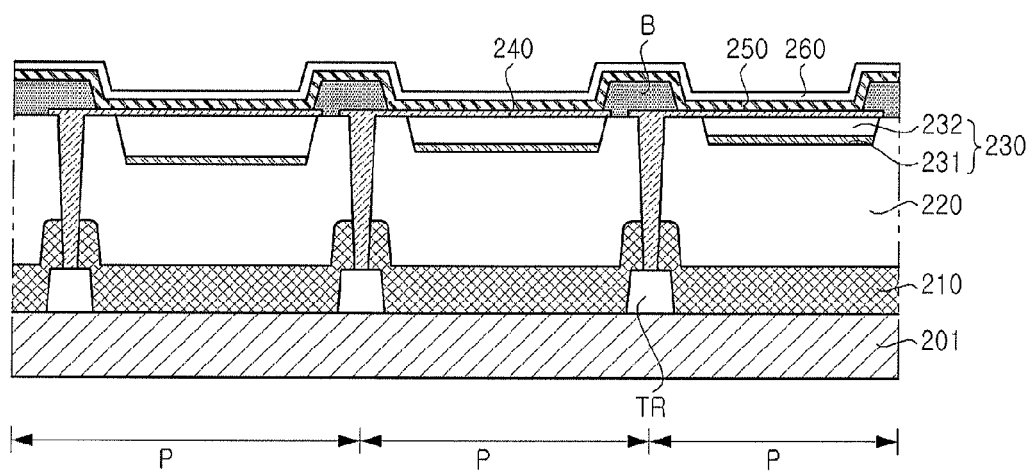

FIGS. 3A to 3C are sectional views illustrating a method of manufacturing the OLED display device according to an embodiment of the present invention.

As illustrated in FIG. 3, first, the thin film transistor TR is formed on the substrate 201. The thin film transistor TR may be formed as at least one or more in each pixel P. The thin film transistor TR illustrated in the drawing may be a driving thin film transistor connected to the anode electrode 240. In the thin film transistor TR, a gate electrode (not shown) may be formed, and then a source electrode (not shown) and a drain electrode (not shown) may be formed with a gate insulating layer (not shown) therebetween. The gate electrode, the source electrode, and the drain electrode may be formed of one of Cu, Al, Cr, Nd, and Mo.

Subsequently, the passivation layer 210 is formed on the thin film transistor TR. The passivation layer 210 may be formed of one of silicon oxide (SiOx) and silicon nitride (SiNx) that are inorganic materials, for insulating the thin film transistor TR from an upper structure and protecting the thin film transistor TR in a later-performed process.

Subsequently, the planarizing layer 220 is formed on the passivation layer 210. The planarizing layer 220 may be formed of an organic material such as acrylate, an epoxy-based polymer, or the like, for planarizing the unevenness of a lower structure. The planarizing layer 220 may be formed by one of a thermal evaporation method and a screen printing method. A liquid organic material having viscosity may be deposited for planarization by one of the methods, and hardened through heat treatment or the like.

The planarizing layer 220 is formed, and then a plurality of grooves G are formed by exposing a surface of the upper end portion of the planarizing layer 220. The grooves G have different depths according to light emitted from the respective pixels P, and thus, the micro-cavity structure may be formed based on an optical distance of the light emitted from the respective pixels P. In an exposure process, a mask is aligned, and then, by differently applying exposure energy for each pixel P, the depths of the grooves G may be formed differently. For example, exposure energy may be differently applied by adjusting an exposure time or an exposure intensity.

As described above, in the present invention, the micro-cavity structure is formed by forming the grooves G having different depths in one-time exposure process, and thus can enhance process efficiency compared to the existing method in which a plurality of exposure processes are performed for forming a plurality of anode electrodes having different thicknesses for each pixel.

Subsequently, as illustrated in FIG. 3B, the reflective electrode 230 is formed in each of the grooves G of the planarizing layer 220. The reflective electrode 230 may be formed using the same mask as a mask used to form the grooves G. The reflective electrode 230 may include the reflective layer 231 and the transparent layer 232.

First, the reflective layer 231 is formed in each of grooves G. The reflective layer 231 may be formed of metal having a high reflectivity, and for example, formed by a sputtering method. Preferably, the reflective layer 231 may be formed of one of Al, Ag, Cu, Ni, Ti, and Ta. The reflective layers 231 of the respective pixels P may preferably have the same thickness, or the reflective layers 231 may have different thicknesses for each pixel P.

Subsequently, the transparent layer 232 may be formed on the reflective layer 231. The transparent layer 232 may be preferably formed of the same material as the anode electrode 240, and for example, formed of ITO, IZO, or ITZO. The transparent layer 232 may be formed to fill the groove G, and preferably, formed such that an upper surface of the planarizing layer 220 matches an upper surface of the transparent layer 232. Accordingly, a thickness of the reflective electrode 230 may preferably be the same as the depth of the groove G. That is, the sum of thicknesses of the reflective layer 231 and transparent layer 232 may be the same value as a depth of the groove G.

Subsequently, as illustrated in FIG. 3C, the anode electrode 240 may be formed on the reflective electrode 230. By patterning the planarizing layer 220 and the passivation layer 210 before forming the anode electrode 240, a contact hole may be formed such that the anode electrode 240 contacts the thin film transistor TR. The planarizing layer 220 and the passivation layer 210 may be patterned simultaneously. Alternatively, when forming the groove G of the planarizing layer 220, by using the same exposure process, the planarizing layer 220 is patterned, the reflective electrode 230 is formed subsequently thereto, and then, in forming the transparent layer 232, when removing a material of the transparent layer 232 filled in the contact hole of the planarizing layer 220, the passivation layer 210 may be patterned simultaneously. By patterning the passivation layer 210, the thin film transistor TR and the anode electrode 240 may be exposed and connected to each other.

Alternatively, the thin film transistor TR may be exposed by simultaneously patterning the planarizing layer 220 and the passivation layer 210 in the same process as a process that forms the groove G in the planarizing layer 220, and then the transparent layer 232 and the anode electrode 240 may be formed of the same material at one time. In performing the above-described processes, the process of forming the transparent layer 232 and the process of forming the anode electrode 240 are unified, thus enhancing process efficiency.

The anode electrode 240 may be preferably formed of ITO, IZO, or ITZO so as to enable the supply of a positive hole to the organic emitting layer 250.

Subsequently, the bank layer B is formed to overlap an edge area of the anode electrode 240. Then, the organic emitting layer 250 may be formed on the bank layer B. In the RGB type in which the organic emitting layer 250 is formed separately in each pixel P, the organic emitting layer 250 may be formed by one of a vacuum evaporation method, a laser heat transfer method, the screen printing method, and the thermal evaporation method, by using an organic material able to emit light of a wavelength suitable for a color of light emitted from each pixel P.

In the WRGB type in which the organic emitting layer 250 is formed in common in the pixels P, the organic emitting layer 250 may be formed using one of the screen printing method and the thermal evaporation method.

Subsequently, the cathode electrode 260 is formed on the organic emitting layer 250. The cathode electrode 260 may be formed of metal for supplying an electron to the organic emitting layer 250, and preferably, may contain one of Ag, Mg, Ca, and Li. The cathode electrode 260 may be formed as a semitransparent thin film able to transmit light. In the bottom emission type, the cathode electrode 260 may be formed opaquely. The cathode electrode 260 may be separated by the optical distance from the reflective electrode 230, thereby forming the micro-cavity structure.

As described above, the grooves G having different depths for each pixel P are formed in the upper end portion of the planarizing layer 220, and the reflective layer 231 which is separated by the optical distance from the cathode electrode 260 is formed in each of the grooves G, thus enhancing efficiency of the process that forms the micro-cavity structure.

According to the present invention, the grooves having different depths for each pixel are formed in the upper end portion of the planarizing layer, and the reflective electrode is formed in each of the grooves, thus reducing the number of mask processes in forming the micro-cavity structure.

Moreover, according to the present invention, by reducing the number of mask processes in forming the micro-cavity structure, process efficiency can be enhanced.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting diode (OLED) display device, comprising:
   a substrate configured to include a plurality of pixels that are defined across a plurality of colors;
   a thin film transistor disposed in each of the pixels defined in the substrate;
   a passivation layer disposed on the thin film transistor, and insulating the thin film transistor;
   a planarizing layer disposed on the passivation layer to planarize unevenness of the thin film transistor, and including a corresponding groove formed in an upper end portion of the planarizing layer in each pixel;
a reflective electrode disposed in the groove of the planarizing layer for each pixel;
an anode electrode disposed on the reflective electrode for each pixel, and connected to the thin film transistor of the corresponding pixel, wherein the anode electrode has a first portion extending through the planarizing layer to connect the thin film transistor and a second portion horizontally disposed above the groove, the second portion of the anode electrode of all the pixels being coplanar;
an organic emitting layer disposed on the anode electrode for each pixel; and
a cathode electrode disposed on the organic emitting layer for each pixel,
wherein the plurality of pixels comprise a red pixel emitting red light, a green pixel emitting green light, and a blue pixel emitting blue light,
a groove depth of the red pixel is deeper than a groove depth of the green pixel, and
the groove depth of the green pixel is deeper than a groove depth of the blue pixel.

2. The OLED display device of claim 1, wherein the reflective electrode is comprised of a transparent layer and a reflective layer.

3. The OLED display device of claim 2, wherein a thickness of the transparent layer and the reflective layer that comprise the reflective electrode is the same as the depth of the groove in the corresponding pixel.

4. The OLED display device of claim 1, wherein the groove in each pixel is positioned at a position to overlap with the anode electrode and the cathode electrode of the corresponding pixel.

5. The OLED display device of claim 1, further comprising a bank layer disposed at a boundary between adjacent pixels.

6. The OLED display device of claim 5, wherein the bank layer is disposed to overlap, at least in part, a portion of the anode electrode.

7. The OLED display device of claim 5, wherein the bank layer is disposed to overlap, at least in part, a portion of two anode electrodes corresponding to two adjacent pixels.

8. The OLED display device of claim 5, wherein the bank layer is disposed to overlap, at least in part, a portion of an anode electrode of a first pixel and a portion of a planarizing layer of a second pixel, wherein the first pixel and second pixel are adjacent.

9. The OLED display device of claim 1, wherein the groove depth is an integer multiple of a half wavelength of light corresponding to the color of the corresponding pixel.

10. The display device of claim 1, wherein an upper surface of the planarizing layer matches an upper surface of the reflective electrode.

11. A method of manufacturing an organic light emitting diode (OLED) display device, comprising:
forming a thin film transistor in each of a plurality of pixels defined in a substrate;
forming a passivation layer, which insulates the thin film transistor, on the thin film transistor;
forming a planarizing layer, which planarizes unevenness of the thin film transistor, on the passivation layer;
forming, in an upper end portion of the planarizing layer, a groove for each of the plurality of pixels;
forming a reflective electrode in each of the grooves formed in the planarizing layer;
forming an anode electrode, connected to the thin film transistor, on the reflective electrode;
forming an organic emitting layer on the anode electrode; and
forming a cathode electrode on the organic emitting layer,
wherein the plurality of pixels comprise a red pixel emitting red light, a green pixel emitting green light, and a blue pixel emitting blue light,
a groove depth of the red pixel is deeper than a groove depth of the green pixel, and
the groove depth of the green pixel is deeper than a groove depth of the blue pixel, and
wherein the anode electrode has a first portion extending through the planarizinq layer to connect the thin film transistor and a second portion horizontally disposed above the groove, the second portion of the anode electrode of all the pixels being coplanar.

12. The method of claim 11, wherein forming the reflective electrode comprises forming a transparent layer and a reflective layer.

13. The method of claim 12, wherein forming the reflective electrode comprises forming the transparent layer and the reflective layer to have a thickness that is the same as the depth of the groove in the corresponding pixel.

14. The method of claim 11, wherein forming the groove in each pixel comprises forming the groove to be positioned to overlap with the anode electrode and the cathode electrode of the corresponding pixel.

15. The method of claim 11, further comprising: forming a bank layer between adjacent pixels.

16. The method of claim 15, wherein forming the bank layer comprises forming the bank layer to overlap, at least in part, a portion of the anode electrode.

17. The method of claim 15, wherein forming the bank layer comprises forming the bank layer to overlap, at least in part, a portion of two anode electrodes corresponding to two adjacent pixels.

18. The method of claim 15, wherein forming the bank layer comprises forming the bank layer to overlap, at least in part, a portion of an anode electrode of a first pixel and a portion of a planarizing layer of a second pixel, wherein the first pixel and second pixel are adjacent.

19. The method of claim 1, wherein forming the groove comprises forming the groove such that the depth of the groove is an integer multiple of a half wavelength of light corresponding to the color of the corresponding pixel.

20. The method of claim 19, wherein the light emitted from the corresponding pixel is at least one of red, greed, or blue light.

21. The method of claim 20, wherein the light emitted from the corresponding pixel further includes white, cyan, magenta, light blue, dark blue, orange, or yellow light.

22. An organic light emitting diode (OLED) display device, comprising:
a substrate configured to include a group of pixels, wherein each pixel corresponds to a different color,
a thin film transistor disposed in each of the pixels defined in the substrate;
a passivation layer disposed on the thin film transistor, and insulating the thin film transistor; and
a planarizing layer disposed on the passivation layer and configured into a plurality of planarizing layer portions such that each planarizing layer portion corresponds to a different colored pixel, wherein each pixel corresponds to a planarizing layer portion, and each planarizing layer portion includes a groove portion having different groove depths that correspond to the different pixel colors, wherein the group of pixels comprises a red pixel emitting red light, a green pixel emitting green light, and a blue pixel emitting blue light,
a groove depth of the red pixel is deeper than a groove depth of the green pixel, and
the groove depth of the green pixel is deeper than a groove depth of the blue pixel,
wherein the anode electrode has a first portion extending through the planarizinq layer to connect the thin film transistor and a second portion horizontally disposed above the groove, the second portion of the anode electrode of all the pixels being coplanar.

23. The display device of claim 22, further comprising:
a reflective electrode disposed in the groove of the planarizing layer portion for each colored pixel;
an anode electrode disposed on the reflective electrode for each colored pixel, and connected to the thin film transistor of the corresponding colored pixel;
an organic emitting layer disposed on the anode electrode for each colored pixel; and
a cathode electrode disposed on the organic emitting layer for each colored pixel.

\* \* \* \* \*